(12) United States Patent
Takaishi

(10) Patent No.: US 8,575,687 B2
(45) Date of Patent: Nov. 5, 2013

(54) SEMICONDUCTOR SWITCH DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 687 days.

(21) Appl. No.: 12/601,923

(22) PCT Filed: May 30, 2008

(86) PCT No.: PCT/JP2008/060007
§ 371 (c)(1),
(2), (4) Date: Nov. 25, 2009

(87) PCT Pub. No.: WO2008/149800
PCT Pub. Date: Dec. 11, 2008

(65) Prior Publication Data
US 2010/0176447 A1    Jul. 15, 2010

(30) Foreign Application Priority Data

May 30, 2007  (JP) ................................. 2007-143214
May 30, 2007  (JP) ................................. 2007-143221

(51) Int. Cl.
*H01L 29/66* (2006.01)

(52) U.S. Cl.
USPC .................................... 257/330; 257/E29.62

(58) Field of Classification Search
USPC .............................. 438/268; 257/330, E29.62
See application file for complete search history.

(56) References Cited

U.S. PATENT DOCUMENTS

| 5,132,238 | A | 7/1992 | Murakami et al. | |
|---|---|---|---|---|
| 6,400,026 | B1 | 6/2002 | Andou et al. | |
| 7,332,770 | B2 * | 2/2008 | Kobayashi | 257/328 |
| 7,400,014 | B2 * | 7/2008 | Thapar | 257/330 |
| 7,843,004 | B2 * | 11/2010 | Darwish | 257/341 |
| 2004/0012050 | A1 * | 1/2004 | Uno et al. | 257/330 |
| 2005/0082640 | A1 | 4/2005 | Takei et al. | |
| 2006/0145247 | A1 * | 7/2006 | Zundel et al. | 257/330 |
| 2007/0114599 | A1 * | 5/2007 | Hshieh | 257/330 |
| 2007/0120194 | A1 * | 5/2007 | Shiraishi et al. | 257/368 |
| 2008/0135931 | A1 * | 6/2008 | Challa et al. | 257/331 |
| 2010/0072546 | A1 | 3/2010 | Takaishi | |

FOREIGN PATENT DOCUMENTS

| EP | 0 339 962 | 2/1989 |
|---|---|---|
| JP | 2-15677 | 1/1990 |
| JP | 3-289141 | 12/1991 |
| JP | 8-213613 | 8/1996 |
| JP | 2000-332239 | 11/2000 |
| JP | 2001-007149 | 1/2001 |
| JP | 2001-168333 | 6/2001 |
| JP | 2003-224277 | 8/2003 |
| JP | 2003-229570 | 8/2003 |
| JP | 2004-356383 | 12/2004 |
| JP | 2005-101551 | 4/2005 |

\* cited by examiner

*Primary Examiner* — William D Coleman
(74) *Attorney, Agent, or Firm* — Fish & Richardson P.C.

(57) ABSTRACT

Provided is a semiconductor device in which on-resistance is largely reduced. The semiconductor device includes an n type epitaxial layer in which each region between neighboring trenches becomes a channel, and a plurality of embedded electrodes each of which is formed on an inner surface of each trench via a silicon oxide film. The plurality of embedded electrodes include two types of embedded electrodes to which voltages are applied separately. By blocking each region between neighboring trenches with a depletion layer formed around every trench, current flowing through each region between the neighboring trenches is interrupted. By deleting the depletion layer formed around the trench filled with the embedded electrode, current can flow through each region between neighboring trenches.

14 Claims, 6 Drawing Sheets

SEMICONDUCTOR SWITCH DEVICE

TECHNICAL FIELD

The present invention relates to a semiconductor device, in particular, a semiconductor device having a switching function.

BACKGROUND ART

Conventionally, a metal oxide semiconductor field effect transistor (MOSFET) is known as a semiconductor device having a switching function (see, for example, Patent Document 1). The Patent Document 1 discloses a trench gate MOSFET (semiconductor device) in which a gate electrode is embedded in a trench formed in a semiconductor layer.

FIG. 9 is a cross sectional view illustrating a structure of a conventional MOSFET (semiconductor device) disclosed in the Patent Document 1. With reference to FIG. 9, the conventional MOSFET (semiconductor device) includes an $n^+$ type semiconductor substrate 101 and an epitaxial layer (semiconductor layer) 102 formed on the upper surface of the semiconductor substrate 101. This epitaxial layer 102 includes an $n^-$ type impurity region (drain region) 102a, a p type impurity region 102b and an $n^+$ type impurity region (source region) 102c formed in this order from the semiconductor substrate 101 side.

In addition, the epitaxial layer 102 is provided with a trench 103 that is formed so as to penetrate the $n^+$ type impurity region 102c and the p type impurity region 102b and to reach a halfway depth of the $n^-$ type impurity region 102a. A gate electrode 105 is embedded in the trench 103 via a gate insulator film 104. In addition, an interlayer insulator film 106 is formed on the upper surface of the epitaxial layer 102 so as to close the opening end of the trench 103.

In addition, a source electrode 107 is formed on the upper surface of the epitaxial layer 102 so as to cover the interlayer insulator film 106. In addition, a drain electrode 108 is formed on the back surface of the semiconductor substrate 101.

In the conventional MOSFET having the above-mentioned structure, applied voltage to the gate electrode 105 is changed for on-off control.

Specifically, when a predetermined positive potential is applied to the gate electrode 105, minority carrier (electrons) in the p type impurity region 102b is attracted to the trench 103 side, and an inversion layer 109 is formed, which connects the $n^-$ type impurity region (drain region) 102a with the $n^+$ type impurity region (source region) 102c. Thus, current can flow between the source electrode 107 and the drain electrode 108 via the inversion layer 109. As a result, the MOSFET is turned on.

In this way, in the conventional MOSFET, the inversion layer 109, which is formed so as to connect the $n^-$ type impurity region (drain region) 102a with the $n^+$ type impurity region (source region) 102c, is made to function as a channel.

In addition, when the application of the predetermined positive potential to the gate electrode 105 is stopped from the above-mentioned state, the inversion layer (channel) 109 disappears so that the current flowing between the source electrode 107 and the drain electrode 108 can be interrupted. As a result, the MOSFET is turned off.

Patent Document 1: JP-A-2001-7149

DISCLOSURE OF THE INVENTION

Problem to be Solved by the Invention

However, in the conventional structure illustrated in FIG. 9, the inversion layer (channel) 109 formed in the turned-on state is very thin, so there is a disadvantage that it is difficult to reduce resistance against the current flowing in the inversion layer (channel) 109. As a result, there is a problem that it is difficult to improve on-resistance.

The present invention is created to solve the above-mentioned problem, and it is an object of the present invention to provide a semiconductor device that can largely reduce on-resistance based on a new principle of operation.

Means for Solving the Problem

In order to achieve the above-mentioned purpose, a semiconductor device according to a first aspect of the present invention includes a semiconductor layer of one conductivity type including a plurality of trenches arranged with predetermined spaces, so that each region between the neighboring trenches becomes a channel, and a plurality of embedded electrodes each of which is formed on an inner surface of each of the plurality of trenches via an insulator film so as to fill in each of the plurality of trenches. Further, the plurality of embedded electrodes include two types, which are a first embedded electrodes and second embedded electrodes to which voltages are applied separately. Each region between the neighboring trenches is blocked with a depletion layer formed around every trench among the plurality of trenches so that current flowing through each region between the neighboring trenches is interrupted. In contrast, the depletion layer formed around the trench filled with the first embedded electrode among the plurality of trenches is deleted so that current can flow through each region between the neighboring trenches.

In the semiconductor device according to the first aspect, as described above, by blocking each region between the neighboring trenches (channel) with the depletion layer formed around every trench, current flowing through each region between the neighboring trenches (channel) is interrupted. In contrast, the depletion layer formed around the trench filled with the first embedded electrode is deleted so that current can flow through each region between the neighboring trenches (channel). Thus, a formation state of the depletion layer formed around the trench filled with the first embedded electrode changes in accordance with the applied voltage to the first embedded electrode. Therefore, by controlling the applied voltage to the first embedded electrode, it is possible to switch from the turned-off state (in which current flowing through each region between the neighboring trenches is interrupted) to the turned-on state (in which current can flow through each region between the neighboring trenches), and to switch in the opposite direction. In other words, the semiconductor device can have a switching function. Further, in the above-mentioned structure, in the turned-on state, the entire part of each region between the neighboring trenches in which the depletion layer is deleted can function as a channel. Therefore, compared with the conventional MOSFET (semiconductor device) in which a very thin inversion layer functions as the channel, resistance against current flowing through the channel can be reduced largely. Thus, compared with the conventional MOSFET (semiconductor device) in which a very thin inversion layer functions as the channel, on-resistance can be reduced largely.

In addition, in the semiconductor device according to the first aspect, as described above, the plurality of embedded electrodes include two types, which are the first embedded electrode and the second embedded electrode, to which voltages are applied separately. Thus, when switching from the turned-off state to the turned-on state, only the depletion layer formed around the trench filled with the first embedded electrode among the plurality of trenches can be deleted while the depletion layer formed around the trench filled with the second embedded electrode can be left over. In this case, if at least one of the second embedded electrodes is disposed between two of the first embedded electrodes, the part of each region between the neighboring trenches (channel) on the second embedded electrode side is always blocked with the depletion layer. Therefore, a threshold voltage when switching from the turned-off state to the turned-on state (applied voltage to the first embedded electrode when the interruption of the current flowing through each region between the neighboring trenches is stopped to be turned on) increases. Thus, it is possible to suppress a tendency of an occurrence of malfunction when noise enters the semiconductor device, that the applied voltage to the first embedded electrode may reach the threshold voltage so as to be turned on despite of the turned-off state is maintained.

In the semiconductor device according to the first aspect, preferably, the plurality of embedded electrodes are arranged with a predetermined spaces so that at least one of the second embedded electrodes is disposed between two of the first embedded electrodes. With this structure, the above-mentioned effect concerning the threshold voltage can easily be obtained.

In the semiconductor device according to the first aspect, preferably, the applied voltage to the second embedded electrode is controlled so that the depletion layer is formed around the trench filled with the second embedded electrode among the plurality of trenches regardless of the case where current flowing through each region between the neighboring trenches is interrupted or the case where current flows through each region between the neighboring trenches. With this structure, the above-mentioned effect concerning the threshold voltage can easily be obtained.

In the semiconductor device according to the first aspect, preferably, a predetermined voltage is applied to the first embedded electrode so that the depletion layer formed around the trench filled with the first embedded electrode among the plurality of trenches is deleted, while the application of the predetermined voltage to the first embedded electrode is stopped so that the depletion layer is formed around the trench filled with the first embedded electrode among the plurality of trenches. With this structure, by controlling the applied voltage to the first embedded electrode, it is easy to switch from the turned-off state to the turned-on state and to switch in the opposite direction.

In the semiconductor device according to the first aspect, preferably, the depletion layers formed around the neighboring trenches are connected to each other when current flowing through each region between the neighboring trenches is interrupted. With this structure, in the turned-off state, each region between the neighboring trenches (channel) can securely be blocked with the depletion layers.

In the semiconductor device according to the first aspect, preferably, a distance between the neighboring trenches is set so that the depletion layers formed around the neighboring trenches are overlapped with each other. With this structure, the depletion layers formed around the neighboring trenches can easily be connected to each other.

Preferably, the semiconductor device according to the first aspect further includes an electrode layer formed on the upper surface of the semiconductor layer so as to cover an opening end of the trench, and an interlayer insulator film for insulating between the embedded electrode and the electrode layer. The embedded electrode is filled in the trench to a halfway depth, and the interlayer insulator film is filled in the remaining part of the trench in which the embedded electrode is not filled in, so that an upper surface of the interlayer insulator film becomes flush with the upper surface of the semiconductor layer. It is to be understood that, throughout the present specification and the appended claims, "halfway" means "anywhere along the given distance (depth)" without limitation to, but not excluding, exact or close equidistance from the ends. With this structure, even if the distance between the neighboring trenches is made to be small, the part of the semiconductor layer on the upper surface side (upper end portion of the region between the neighboring trenches) is not entirely covered with the interlayer insulator film. Thus, the distance between the neighboring trenches can be reduced, so that the depletion layers formed around the neighboring trenches can easily be connected to each other.

The semiconductor device according to the second aspect of the present invention includes a semiconductor layer of one conductivity type including a plurality of trenches arranged with predetermined spaces, so that each region between the neighboring trenches becomes a channel, a first embedded electrode filled in a predetermined trench among the plurality of trenches via an insulator film, and a second embedded electrode filled in a trench other than the trench filled with the first embedded electrode, so as to be applied with a voltage separately from the first embedded electrode and to have a Schottky contact with the semiconductor layer inside the trench. Further, each region between the neighboring trenches is blocked with a depletion layer formed around every trench among the plurality of trenches so that current flowing through each region between the neighboring trenches is interrupted. In contrast, the depletion layer formed around the trench filled with the first embedded electrode among the plurality of trenches is deleted so that current can flow through each region between the neighboring trenches.

In the semiconductor device according to the second aspect, as described above, by blocking each region between the neighboring trenches (channel) with the depletion layer formed around every trench, current flowing through each region between the neighboring trenches (channel) is interrupted. In contrast, by deleting the depletion layer formed around the trench filled with the first embedded electrode, current can flow through each region between the neighboring trenches (channel). Thus, a formation state of the depletion layer formed around the trench filled with the first embedded electrode changes in accordance with the applied voltage to the first embedded electrode. Therefore, by controlling the applied voltage to the first embedded electrode, it is possible to switch from the turned-off state (in which current flowing through each region between the neighboring trenches is interrupted) to the turned-on state (in which current can flow through each region between the neighboring trenches), and to switch in the opposite direction. In other words, the semiconductor device can have a switching function. Further, in the above-mentioned structure, in the turned-on state, the entire part of each region between the neighboring trenches in which the depletion layer is deleted can function as a channel. Therefore, compared with the conventional MOSFET (semiconductor device) in which a very thin inversion layer functions as the channel, resistance against current flowing through the channel can be reduced largely. Thus, compared with the conventional MOSFET (semiconductor device) in which a very thin inversion layer functions as the channel, on-resistance can be reduced largely.

In addition, in the semiconductor device according to the second aspect, as described above, there are provided the first embedded electrode and the second embedded electrode that is applied with a voltage separately from the first embedded electrode. Thus, when switching from the turned-off state to the turned-on state, only the depletion layer formed around the trench filled with the first embedded electrode among the plurality of trenches can be deleted while the depletion layer formed around the trench filled with the second embedded electrode can be left over. In this case, if at least one of the second embedded electrodes is disposed between two of the first embedded electrodes, a part of each region between the neighboring trenches (channel) on the second embedded electrode is always blocked with the depletion layer. Therefore, a threshold voltage when switching from the turned-off state to the turned-on state (applied voltage to the first embedded electrode when the interruption of the current flowing through each region between the neighboring trenches is stopped to be turned on) increases. Thus, it is possible to suppress a tendency of an occurrence of malfunction when noise enters the semiconductor device, that the applied voltage to the first embedded electrode may reach the threshold voltage so as to be turned on despite of the turned-off state is maintained.

In addition, in the semiconductor device according to the second aspect, as described above, the second embedded electrode has a Schottky contact with the semiconductor layer inside the trench. Therefore, the depletion layer can be formed around the trench filled with the second embedded electrode with a simple structure without an insulator film or the like.

Preferably, the semiconductor device according to the second aspect further includes an electrode layer formed on the upper surface of the semiconductor layer. The electrode layer includes an embedded portion filled in a trench other than the trench filled with the first embedded electrode, and the second embedded electrode is constituted of the embedded portion of the electrode layer. With this structure, in the process of forming the electrode layer, the second embedded electrode (embedded portion of the electrode layer) can also be formed simultaneously. Further, the step of electrically connecting the electrode layer to the second embedded electrode (embedded portion of the electrode layer) becomes unnecessary. Thus, the manufacturing process can be simplified.

In the semiconductor device according to the second aspect, preferably, the first embedded electrode and the second embedded electrode are filled in the plurality of trenches so that at least one of the second embedded electrodes is disposed between two of the first embedded electrodes. With this structure, the above-mentioned effect concerning the threshold voltage can easily be obtained can easily be obtained.

In the semiconductor device according to the second aspect, preferably, the applied voltage to the second embedded electrode is controlled so that the depletion layer is formed around the trench filled with the second embedded electrode regardless of the case where current flowing through each region between the neighboring trenches is interrupted or the case where current flows through each region between the neighboring trenches. With this structure, the above-mentioned effect concerning the threshold voltage can easily be obtained.

In the semiconductor device according to the second aspect, preferably, a predetermined voltage is applied to the first embedded electrode so that the depletion layer formed around the trench filled with the first embedded electrode is deleted, while the application of the predetermined voltage to the first embedded electrode is stopped so that the depletion layer is formed around the trench filled with the first embedded electrode. With this structure, by controlling the applied voltage to the first embedded electrode, it is easy to switch from the turned-off state to the turned-on state and to switch in the opposite direction.

In the semiconductor device according to the second aspect, preferably, the depletion layers formed around the neighboring trenches are connected to each other when current flowing through each region between the neighboring trenches is interrupted. With this structure, in the turned-off state, each region between the neighboring trenches (channel) can securely be blocked with the depletion layer.

In the semiconductor device according to the second aspect, preferably, a distance between the neighboring trenches is set so that the depletion layers formed around the neighboring trenches are overlapped with each other. With this structure, the depletion layers formed around the neighboring trenches can easily connected to each other.

Effects of the Invention

As described above, according to the present invention, the semiconductor device that can largely reduce on-resistance based on a new principle of operation can easily be obtained.

Figure 1:
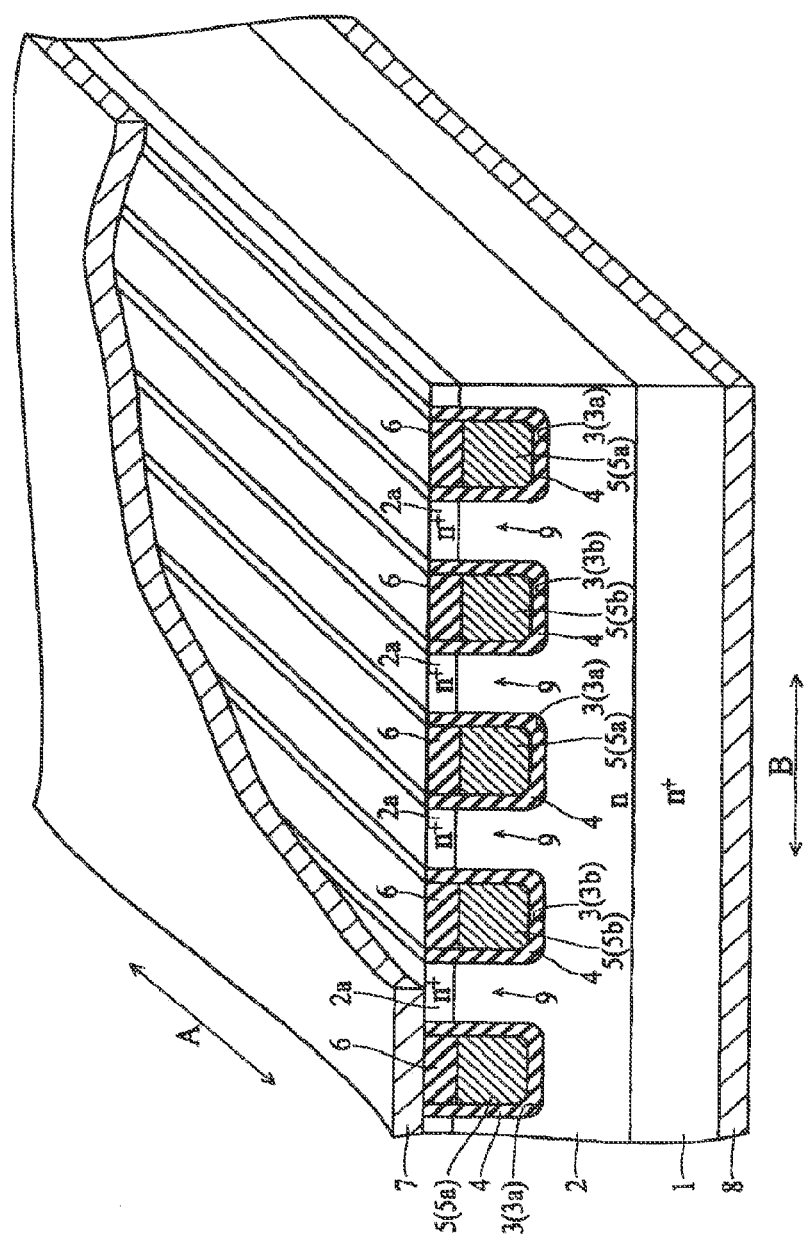
FIG. 1 is a cross sectional perspective view illustrating a semiconductor device according to a first embodiment of the present invention.

EXPLANATION OF NUMERALS 1, 11 $n^+$ type silicon substrate (semiconductor layer)
2, 12 n type epitaxial layer (semiconductor layer)
3, 3a, 3b, 13, 13a, 13b trench
4, 14 silicon oxide film (insulator film)
5 embedded electrode
5a embedded electrode (first embedded electrode)
5b embedded electrode (second embedded electrode)
6, 16 interlayer insulator film
7, 17 source electrode (electrode layer)
9, 19 channel
10, 10a, 10b, 20, 20a, 20b depletion layer
15 embedded electrode (first embedded electrode)
17a embedded portion (second embedded electrode)

BEST MODE FOR CARRYING OUT THE INVENTION (First Embodiment)

First, with reference to FIGS. 1 and 2, a structure of a semiconductor device according to a first embodiment will be described. Note that the semiconductor device of the first embodiment is structured to function as a normally-off type switch device.

In the semiconductor device of the first embodiment, as illustrated in FIG. 1, an n type epitaxial layer 2 made of n type silicon having a thickness of approximately 1 to 10 μm is formed on an upper surface of an n$^+$ type silicon substrate 1. An n type impurity is doped into the n$^+$ type silicon substrate 1 at a high concentration so that a good ohmic contact is obtained with the drain electrode 8 that will be described later. In addition, an n type impurity is doped into the n type epitaxial layer 2 at a concentration (approximately $5 \times 10^{15}$ to $1 \times 10^{18}$ cm$^{-3}$) that is lower than the concentration in the n$^+$ type silicon substrate 1. Note that the n$^+$ type silicon substrate 1 and the n type epitaxial layer 2 is an example of the "semiconductor layer of one conductivity type" in the present invention.

In addition, the n type epitaxial layer 2 has a plurality of trenches 3 dug in the thickness direction. The plurality of trenches 3 are formed by etching predetermined regions of the n type epitaxial layer 2 from the upper surface (principal surface) side. In other words, opening ends of the plurality of trenches 3 are positioned on the upper surface of the n type epitaxial layer 2.

In addition, each of the plurality of trenches 3 is formed in an elongated shape so as to extend in a predetermined direction (A direction) that is parallel to the upper surface of the n type epitaxial layer 2. In addition, the plurality of trenches 3 are arranged in the direction (B direction) that is parallel to the upper surface of the n type epitaxial layer 2 and is perpendicular to the extending direction of the trench 3 (A direction) with spaces of approximately 0.05 to 0.3 μm between them. Further, the depth of each of the plurality of trenches 3 is set to approximately 0.5 to 5 μm that is smaller than the thickness of the n type epitaxial layer 2 (approximately 1 to 10 μm). In addition, the width of each of the plurality of trenches 3 in the B direction is set to approximately 0.1 to 1 μm.

In addition, on the inner surface of each of the plurality of trenches 3, there is formed a silicon oxide film 4 obtained by a thermal oxidation process of the n type silicon constituting the n type epitaxial layer 2, at a thickness of approximately 10 to 100 nm. Note that the silicon oxide film 4 is an example of the "insulator film" in the present invention.

In addition, on the inner surface of each of the plurality of trenches 3, there is formed an embedded electrode 5 made of p type polysilicon via the silicon oxide film 4. Each of the plurality of embedded electrodes 5 is filled in the corresponding trench 3 to a halfway depth thereof. It is to be understood that, throughout the present specification and the appended claims, "halfway" means "anywhere along the given distance (depth)" without limitation to, but not excluding, exact or close equidistance from the ends. Note that a metal or the like can be used instead of the p type polysilicon as a structural material of the embedded electrode 5.

In the first embodiment, the plurality of embedded electrodes 5 are disposed as described above, so as to control the applied voltage to the plurality of embedded electrodes 5. Thus, it is possible to form a depletion layer around each of the plurality of trenches 3 or to delete the formed depletion layer. Further, in the first embodiment, a distance between the neighboring trenches 3 is set so that when the depletion layer is formed around each of the plurality of trenches 3, the depletion layers formed around neighboring trenches 3 are overlapped with each other. In other words, when the depletion layer is formed around each of the plurality of trenches 3, the depletion layers formed around neighboring trenches 3 are connected to each other. Therefore, in the first embodiment, when the depletion layer is formed around each of the plurality of trenches 3, each region between the neighboring trenches 3 can be blocked with the depletion layer.

In addition, an interlayer insulator film 6 made of a silicon oxide film is embedded in the remaining part that is not filled with the embedded electrode 5 of each of the plurality of trenches 3 (part over the embedded electrode 5). Each of the plurality of interlayer insulator films 6 is provided for insulating between the corresponding embedded electrode 5 and a source electrode 7 that will be described later. In addition, the thickness of each of the plurality of interlayer insulator films 6 is set to be the same as the depth of the remaining part that is not filled with the embedded electrode 5 of the corresponding trench 3 (part over the embedded electrode 5). Therefore, the upper surface of each of the plurality of interlayer insulator films 6 is flush with the upper surface of the n type epitaxial layer 2 (upper surface of the upper end portion of each region between neighboring trenches 3).

In addition, on the upper surface portion of the n type epitaxial layer 2 (upper end portion of each region between the neighboring trenches 3), there is formed a high concentration region 2a in which the n type impurity is doped at high concentration by ion injection so that a low concentration region is not exposed on the upper surface of the n type epitaxial layer 2. The concentration of the high concentration region 2a of the n type epitaxial layer 2 is set so that a good ohmic contact can be obtained with the source electrode 7 that will be described later, and is higher than concentration in other part of the n type epitaxial layer 2. In addition, the thickness of the high concentration region 2a in the n type epitaxial layer 2 (depth of the ion injection) is set to be smaller than the thickness of the interlayer insulator film 6. In other words, the lower end portion of the high concentration region 2a in the n type epitaxial layer 2 is positioned higher than the upper end portion of the embedded electrode 5.

In addition, on the upper surface of the n type epitaxial layer 2, there is formed the source electrode 7 made of an aluminum layer so as to cover the opening ends of the plurality of trenches 3. This source electrode 7 has an ohmic contact with the high concentration region 2a of the n type epitaxial layer 2 (upper end portion of each region between the neighboring trenches 3). Note that the source electrode 7 is an example of the "electrode layer" in the present invention. In addition, on the back surface of the n$^+$ type silicon substrate 1, there is formed a drain electrode 8 constituted of a multilayer structure including a plurality of laminated metal layers. This drain electrode 8 has an ohmic contact with the n$^+$ type silicon substrate 1.

In the structure described above, when a voltage is applied between the source electrode 7 and the drain electrode 8, current flowing between the source electrode 7 and the drain electrode 8 (current flowing in the thickness direction of the n type epitaxial layer 2) passes through each regions between the neighboring trenches 3 of the n type epitaxial layer 2. In other words, in the structure described above, each region between the neighboring trenches 3 in the n type epitaxial layer 2 functions as a channel 9.

Figure 2:
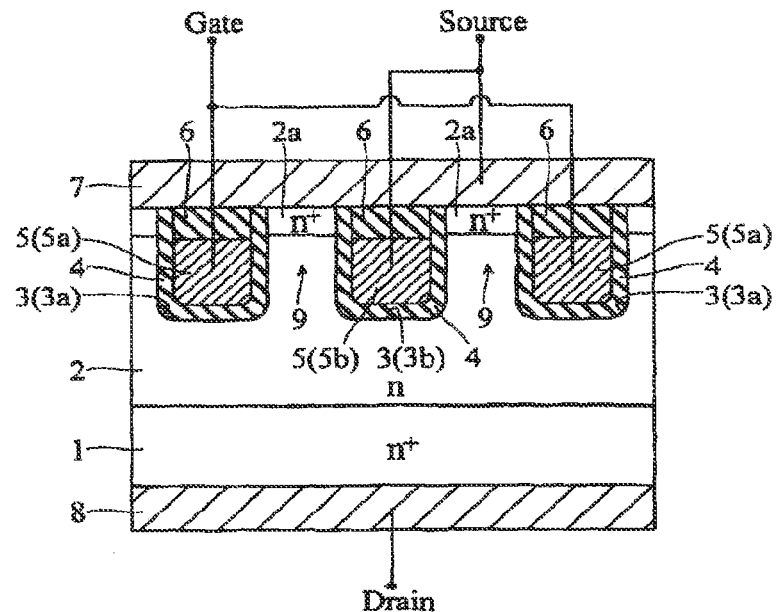
FIG. 2 is a cross sectional view illustrating connection positions of embedded electrodes of the semiconductor device according to a first embodiment illustrated in FIG. 1.

Here, in the first embodiment, as illustrated in FIG. 2, the plurality of embedded electrodes 5 are divided into two types of embedded electrodes (gate electrodes) 5a and embedded electrodes (common electrodes) 5b that are applied with voltages separately. Specifically, one type of embedded electrodes (gate electrodes) 5a are applied with a voltage corresponding to a predetermined control signal. In addition, the other type of embedded electrodes (common electrodes) 5b are electrically connected to the source electrode 7. In other words, the other type of embedded electrodes (common electrodes) 5b have the same potential as the source electrode 7. The one type of embedded electrodes (gate electrodes) 5a and the other type of embedded electrodes (common electrodes) 5b have similar structure except that electrical connection positions are different between them. Note that the one type of embedded electrodes (gate electrodes) 5a and the other type of embedded electrodes (common electrodes) 5b are examples of the "first embedded electrode" and the "second embedded electrode" in the present invention, respectively.

Further, in the first embodiment, as illustrated in FIG. 1, the plurality of embedded electrodes 5 fill in the plurality of trenches 3 so that the embedded electrodes (gate electrodes) 5a and the embedded electrodes (common electrodes) 5b are disposed alternately one by one in the B direction. In other words, one embedded electrode (common electrode) 5b is disposed between two embedded electrodes (gate electrodes) 5a.

Figure 3:
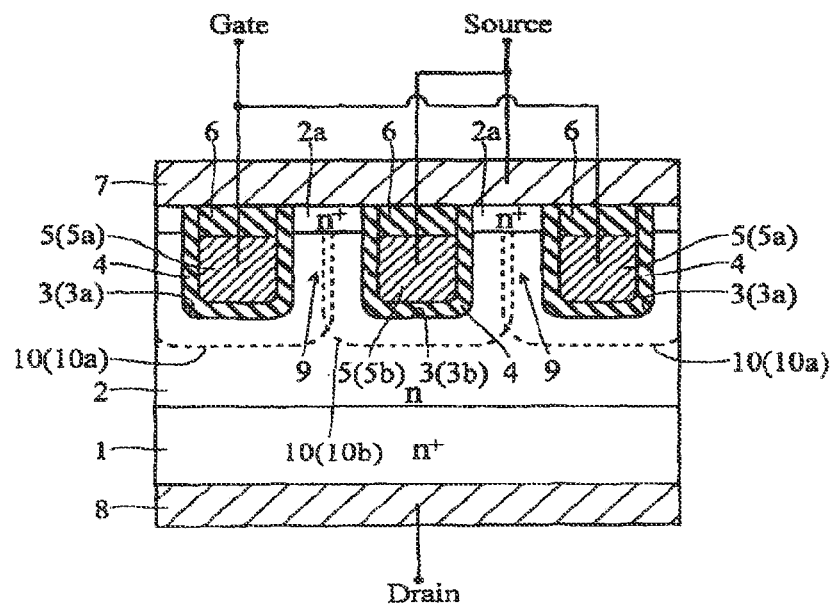
FIG. 3 is a cross sectional view illustrating an operation of the semiconductor device according to the first embodiment of the present invention.

Next, with reference to FIGS. 3 and 4, an operation of the semiconductor device that functions as a switch device of the first embodiment will be described. FIG. 3 illustrates the case where the semiconductor device that functions as a switch device is in the turned-off state, and FIG. 4 illustrates the case where the semiconductor device that functions as a switch device is in the turned-on state.

Note that in the following description it is supposed that a negative potential is applied to the source electrode 7, and a positive potential is applied to the drain electrode 8. In other words, if the semiconductor device that functions as a switch device is in the turned-on state, current flows from the drain electrode 8 to the source electrode 7 (in the arrow direction in FIG. 4).

Figure 4:
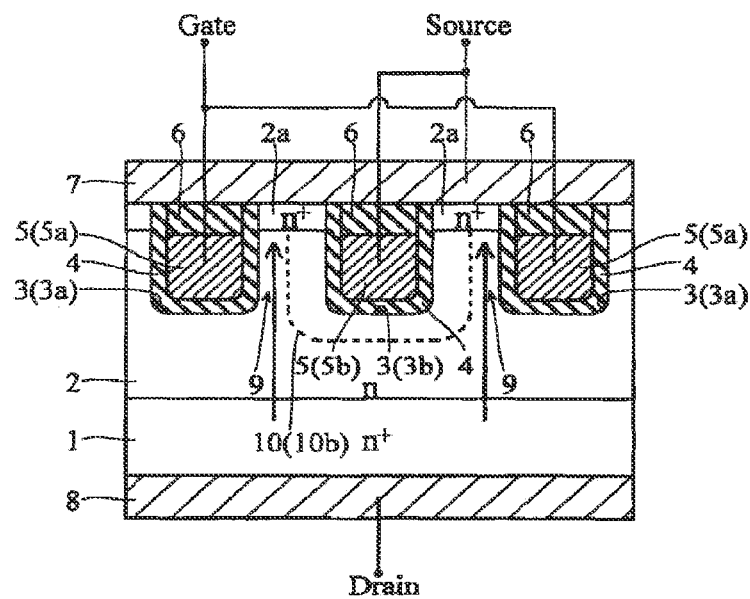
FIG. 4 is a cross sectional view illustrating an operation of the semiconductor device according to the first embodiment of the present invention.

First, as illustrated in FIGS. 3 and 4, when a negative potential and a positive potential are applied to the source electrode 7 and the drain electrode 8, respectively, the negative potential is applied to the embedded electrode (common electrode) 5b because the embedded electrode (common electrode) 5b is electrically connected to the source electrode 7. Therefore, the periphery of the trench 3 (hereinafter referred to as a trench 3b) filled with the embedded electrode (common electrode) 5b is in the state where majority carrier is always decreased. In other words, a depletion layer 10 (10b) is always formed around the trench 3b regardless of the turned-on state or the turned-off state.

Further, as illustrated in FIG. 3, if the semiconductor device that functions as a switch device is in the turned-off state, the applied voltage to the embedded electrode (gate electrode) 5a is controlled so that the majority carrier existing around the trench 3 (hereinafter referred to as a trench 3a) filled with the embedded electrode (gate electrode) 5a decreases. Thus, around the trench 3a, there is formed a depletion layer 10 (10a) that is similar to the depletion layer 10 (10b) formed around the trench 3b.

In this case, in the region between the trenches 3a and 3b, the depletion layers 10a and 10b formed around the trenches 3a and 3b are overlapped with each other. In other words, in the region between the trenches 3a and 3b, the depletion layers 10a and 10b are connected to each other. Thus, the channel 9 is blocked with the depletion layers 10a and 10b, so that current flowing through the channel 9 can be interrupted. Therefore, the semiconductor device that functions as a switch device becomes turned off.

Next, if the semiconductor device that functions as a switch device is to be switched from the turned-off state to the turned-on state, as illustrated in FIG. 4, a predetermined positive potential (predetermined voltage) is applied to the embedded electrode (gate electrode) 5a, so that the depletion layer 10a (see FIG. 3) formed around the trench 3a is deleted. In other words, the depletion layer 10a that blocks the part of the channel 9 on the embedded electrode (gate electrode) 5a side is deleted. Thus, current can flow through the part of the channel 9 on the embedded electrode (gate electrode) 5a side, so that the semiconductor device that functions as a switch device can be turned on.

In addition, if the semiconductor device that functions as a switch device is to be switched from the turned-on state to the turned-off state, the application of the predetermined positive potential to the embedded electrode (gate electrode) 5a is stopped. Thus, the state illustrated in FIG. 3 is restored, so that the semiconductor device that functions as a switch device can be turned off.

In the first embodiment, as described above, by blocking the channel 9 (each region between the neighboring trenches 3) with the depletion layer 10 formed around all the trenches 3, current flowing through the channel 9 (each region between the neighboring trenches 3) is interrupted. In contrast, by deleting the depletion layer 10a formed around the trench 3a filled with the embedded electrode (gate electrode) 5a, current can flow through the channel 9 (each region between the neighboring trenches 3). Thus, a formation state of the depletion layer 10a formed around the trench 3a changes in accordance with the applied voltage to the embedded electrode (gate electrode) 5a. Therefore, by controlling the applied voltage to the embedded electrode 5a, it is possible to switch from the turned-off state (in which current flowing through the channel 9 is interrupted) to the turned-on state (in which current can flow through the channel 9), and to switch in the opposite direction. In other words, the semiconductor device can have a switching function. Further, in the above-mentioned structure, in the turned-on state, the entire portion of each region between the neighboring trenches 3 in which the depletion layer 10a is deleted can function as the channel 9. Therefore, compared with the conventional MOSFET (semiconductor device) in which a very thin inversion layer functions as the channel, resistance against current flowing through the channel 9 can be reduced largely. Thus, compared with the conventional MOSFET (semiconductor device) in which a very thin inversion layer functions as the channel, on-resistance can be reduced largely.

In addition, in the first embodiment, as described above, the plurality of embedded electrodes 5 is divided into two types including the embedded electrodes (gate electrodes) 5a and the embedded electrodes (common electrodes) 5b to which voltages are applied separately. Thus, when the switching from the turned-off state to the turned-on state is carried out, only the depletion layer 10a formed around the trench 3a filled with the embedded electrode (gate electrode) 5a among the plurality of trenches 3 can be deleted while the depletion layer 10b formed around the trench 3b filled with the embedded electrode (common electrode) 5b can be left over. In this case, if one embedded electrode (common electrode) 5b is disposed between the two embedded electrodes (gate electrodes) 5a, the part of the channel 9 (each region between the neighboring trenches 3) on the embedded electrode (common electrode) 5b side is always blocked with the depletion layer 10b. Therefore, a threshold voltage when the switching from the turned-off state to the turned-on state is carried out (applied voltage to the embedded electrode (gate electrode) 5a when the interruption of the current flowing through the channel 9 is stopped so as to be turned on) is increased. Thus, it is possible to suppress a tendency of an occurrence of malfunction when noise enters the semiconductor device that the applied voltage to the embedded electrode (gate electrode) 5a may reach the threshold voltage so as to be turned on despite of the turned-off state is maintained.

In addition, in the first embodiment, as described above, the predetermined positive potential is applied to the embedded electrode (gate electrode) 5a so that depletion layer 10a formed around the trench 3a is deleted while the application of the predetermined positive potential to the embedded electrode (gate electrode) 5a is stopped so that the depletion layer 10a is formed around the trench 3a. With this structure, by controlling the applied voltage to the embedded electrode (gate electrode) 5a, it is easy to switch from the turned-off state to the turned-on state and to switch in the opposite direction.

In addition, in the first embodiment, as described above, in the turned-off state, the depletion layers 10 formed around neighboring trenches 3 are connected to each other so that the channel 9 (each region between the neighboring trenches 3) can securely be blocked with the depletion layer 10.

In addition, in the first embodiment, as described above, the distance between the neighboring trenches 3 is set so that the depletion layers 10 formed around neighboring trenches 3 are overlapped with each other. Thus, the depletion layers 10 formed around neighboring trenches 3 can be connected to each other.

In addition, in the first embodiment, as described above, the interlayer insulator film 6 is filled in the trench 3 so that the upper surface of the interlayer insulator film 6 becomes flush with the upper surface of the n type epitaxial layer 2. Thus, even if the distance between the neighboring trenches 3 is made to be small, the part of the n type epitaxial layer 2 on the upper surface side (upper end portion of the region between the neighboring trenches 3) is not entirely covered with the interlayer insulator film 6. Thus, the distance between the neighboring trenches 3 can be reduced, so that the depletion layers 10 formed around neighboring trenches 3 can easily be connected with each other.

(Second Embodiment)

Next, with reference to FIGS. 5 and 6, a structure of a semiconductor device according to a second embodiment will be described. Note that the semiconductor device of the second embodiment is adapted to function as a normally-off type switch device.

Figure 5:
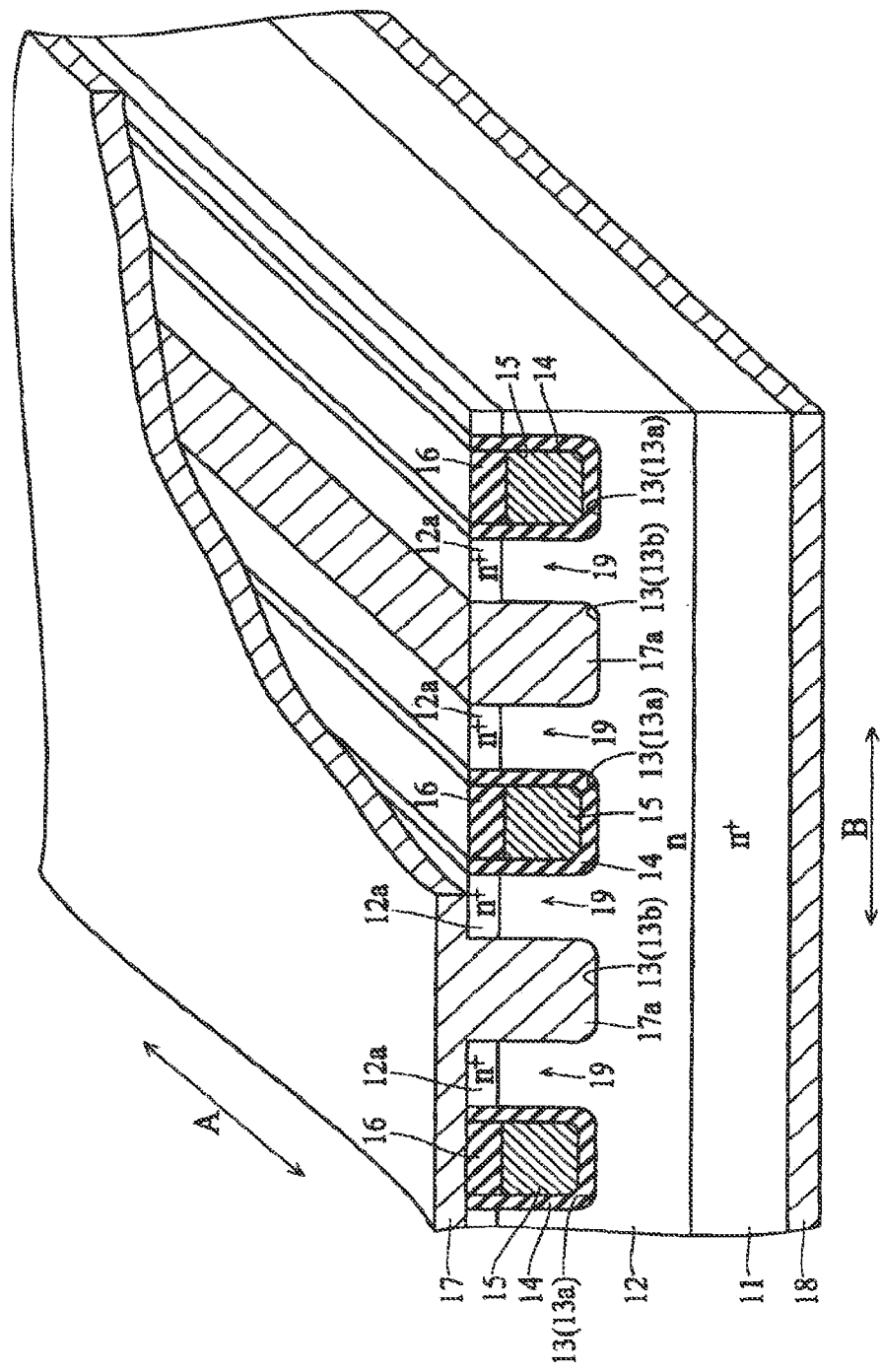
FIG. 5 is a cross sectional perspective view of a semiconductor device according to a second embodiment of the present invention.
Figure 6:
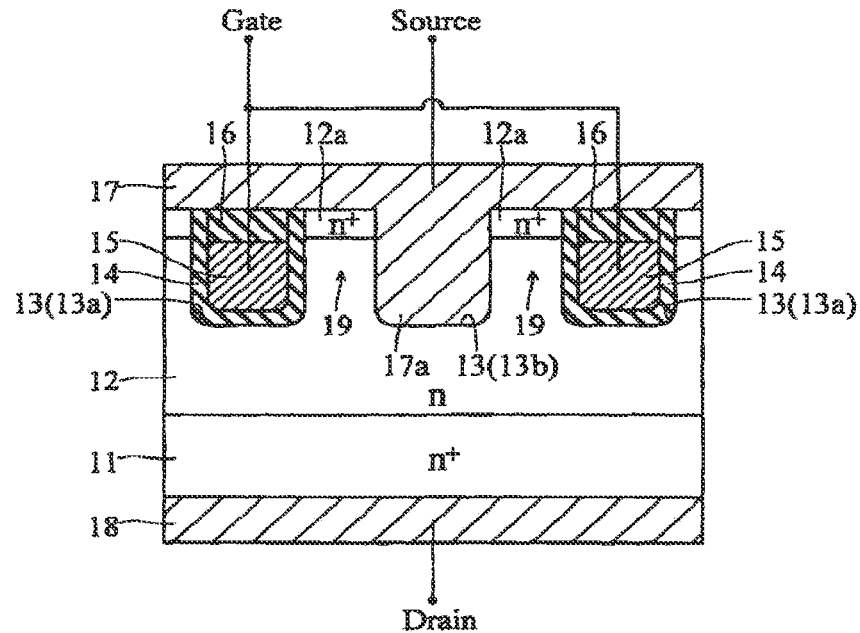
FIG. 6 is a cross sectional view illustrating connection positions of embedded electrodes of the semiconductor device according to the second embodiment illustrated in FIG. 5.

As illustrated in FIGS. 5 and 6, in the semiconductor device of the second embodiment, an n type epitaxial layer 12 made of n type silicon having a thickness of approximately 1 to 10 μm is formed on the upper surface of an n$^+$ type silicon substrate 11. In the n$^+$ type silicon substrate 11, n type impurity is doped at a high concentration so that a good ohmic contact can be obtained with the drain electrode 18 that will be described later. In addition, in the n type epitaxial layer 12, n type impurity is doped at a concentration (approximately $5 \times 10^{15}$ to $1 \times 10^{18}$ cm$^{-3}$) that is lower than the concentration in the n$^+$ type silicon substrate 11. Note that each of the n$^+$ type silicon substrate 11 and the n type epitaxial layer 12 is an example of the "semiconductor layer of one conductivity type" in the present invention.

In addition, the n type epitaxial layer 12 has a plurality of trenches 13 dug in the thickness direction thereof. The plurality of trenches 13 are formed by etching predetermined regions of the n type epitaxial layer 12 from the upper surface (principal surface) side. In other words, opening ends of the plurality of trenches 13 are positioned on the upper surface of the n type epitaxial layer 12.

In addition, each of the plurality of trenches 13 is formed in an elongated shape so as to extend in a predetermined direction (A direction) that is parallel to the upper surface of the n type epitaxial layer 12. In addition, the plurality of trenches 13 are arranged in the direction (B direction) that is parallel to the upper surface of the n type epitaxial layer 12 and is perpendicular to the extending direction of the trench 13 (A direction) with spaces of approximately 0.05 to 0.3 μm between them. Further, the depth of each of the plurality of trenches 13 is set to approximately 0.5 to 5 μm that is smaller than the thickness of the n type epitaxial layer 12 (approximately 1 to 10 μm). In addition, the width of each of the plurality of trenches 13 in the B direction is set to approximately 0.1 to 1 μm.

In addition, on the inner surface of a predetermined trench 13a of the plurality of trenches 13, there is formed a silicon oxide film 14 at a thickness of approximately 10 to 100 nm, which is obtained by a thermal oxidation process of the n type silicon constituting the n type epitaxial layer 12. The silicon oxide film 14 is formed only in the predetermined trench 13a and is not formed in the other trenches 13b than the predetermined trench 13a. Further, in the second embodiment, the trenches 13a in which the silicon oxide film 14 is formed and the trenches 13b in which the silicon oxide film 14 is not formed are arranged alternately one by one in the B direction. In other words, one trench 13b is disposed between two trenches 13a. Note that the silicon oxide film 14 is an example of the "insulator film" in the present invention.

In addition, on the inner surface of the predetermined trench 13a, there is formed an embedded electrode (gate electrode) 15 made of p type polysilicon via the silicon oxide film 14. As the material of the embedded electrode (gate electrode) 15, a metal or the like can also be used instead of the p type polysilicon. In addition, the embedded electrode (gate electrode) 15 is filled in the trench 13a to a halfway depth. With this embedded electrode (gate electrode) 15, by controlling an applied voltage to the embedded electrode (gate electrode) 15, it is possible to form a depletion layer around the trench 13a or to delete the formed depletion layer. Note that the embedded electrode (gate electrode) 15 is an example of the "first embedded electrode" in the present invention.

In addition, an interlayer insulator film 16 made of a silicon oxide film is filled in the remaining part that is not filled with the embedded electrode (gate electrode) 15 (part over the embedded electrode 15) of the trench 13a. The interlayer insulator film 16 is provided for insulating between the embedded electrode (gate electrode) 15 and the source electrode 17 that will be described later. In addition, the thickness of the interlayer insulator film 16 is set to be the same as the depth of the remaining part that is not filled with the embedded electrode (gate electrode) 15 of the trench 13a (part over the embedded electrode 15). Therefore, the upper surface of the interlayer insulator film 16 is flush with the upper surface of the n type epitaxial layer 12 (upper surface of the upper end portion of each region between the neighboring trenches 13).

In addition, on the upper surface portion of the n type epitaxial layer 12 (upper end portion of each region between the neighboring trenches 13), there is formed a high concentration region 12a in which the n type impurity is doped at high concentration by ion injection so that a low concentration region is not exposed on the upper surface of the n type epitaxial layer 12. The concentration of the high concentration region 12a in the n type epitaxial layer 12 is set so that a good ohmic contact can be obtained with the source electrode 17 that will be described later, and is higher than concentration in other part of the n type epitaxial layer 12. In addition, the thickness of the high concentration region 12a in the n type epitaxial layer 12 (depth of the ion injection) is set to be smaller than the thickness of the interlayer insulator film 16. In other words, the lower end portion of the high concentration region 12a of the n type epitaxial layer 12 is positioned higher than the upper end portion of the embedded electrode (gate electrode) 15.

In addition, on the upper surface of the n type epitaxial layer 12, there is formed the source electrode 17 made of an aluminum layer so as to cover the opening ends of the plurality of trenches 13. This source electrode 17 has an ohmic contact with the high concentration region 12a of the n type epitaxial layer 12 (upper end portion of each region between the neighboring trenches 13). Note that the source electrode 17 is an example of the "electrode layer" in the present invention.

Here, the source electrode 17 of the second embodiment is adapted to have a Schottky contact with the n type epitaxial layer 12 inside the trench 13b other than the trench 13a filled with the embedded electrode (gate electrode) 15. Specifically, an embedded portion (embedded electrode) 17a for filling in the trench 13b completely is provided integrally to the source electrode 17. Further, the embedded portion 17a of the source electrode 17 has a Schottky contact with the n type epitaxial layer 12 in the trench 13b. With this structure, by controlling the applied voltage to the embedded portion 17a of the source electrode 17, the depletion layer can be formed around the trench 13b. Note that the embedded portion 17a of the source electrode 17 is an example of the "second embedded electrode" in the present invention.

In addition, the embedded electrode (gate electrode) 15 is filled in the trench 13a while the embedded portion 17a of the source electrode 17 is filled in the trench 13b, so the embedded electrodes (gate electrodes) 15 and the embedded portions 17a of the source electrode 17 are arranged alternately one by one in the B direction. In other words, one embedded portion 17a of the source electrode 17 is disposed between two embedded electrodes (gate electrodes) 15.

Further, in the second embodiment, the distance between the trench 13a filled with the embedded electrode (gate electrode) 15 and the trench 13b filled with the embedded portion 17a of the source electrode 17 is set so that the depletion layers formed around the trenches 13a and 13b are overlapped with each other when the depletion layers are formed around the trenches 13a and 13b. In other words, when the depletion layers are formed around the trenches 13a and 13b, the depletion layers formed around the trenches 13a and 13b are connected to each other. Therefore, in the present embodiment, if the depletion layers are formed around the trenches 13a and 13b, each region between the trench 13a and the trench 13b can be blocked with the depletion layer.

In addition, on the back surface of the n⁺ type silicon substrate 11, there is formed a drain electrode 18 constituted of a multilayer structure including a plurality of laminated metal layers. The drain electrode 18 has an ohmic contact with the n⁺ type silicon substrate 11.

In the structure described above, when a voltage is applied between the source electrode 17 and the drain electrode 18, current flowing through between the source electrode 17 and the drain electrode 18 (current flowing in the thickness direction of the n type epitaxial layer 12) passes through each region between the neighboring trenches 13 in the n type epitaxial layer 12. In other words, in the structure described above, each region between the neighboring trenches 13 in the n type epitaxial layer 12 functions as the channel 19.

Figure 7:
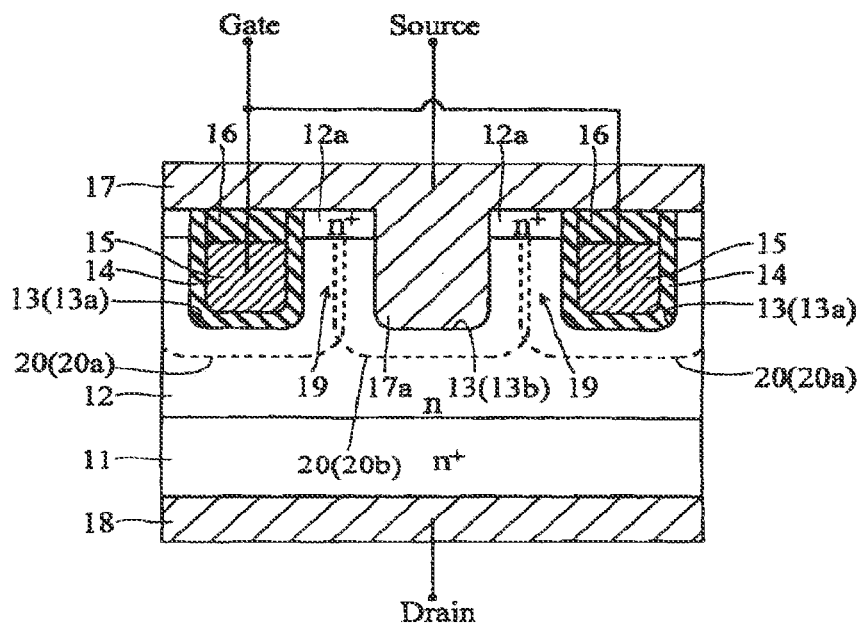
FIG. 7 is a cross sectional view illustrating an operation of the semiconductor device according to the second embodiment of the present invention.

Next, with reference to FIGS. 7 and FIG. 8, an operation of the semiconductor device that functions as a switch device of the second embodiment will be described. FIG. 7 illustrates the case where the semiconductor device that functions as a switch device is in the turned-off state, FIG. 8 illustrates the case where the semiconductor device that functions as a switch device is in the turned-on state.

Note that it is supposed in the following description that a negative potential is applied to the source electrode 17 while a positive potential is applied to the drain electrode 18. In other words, if the semiconductor device that functions as a switch device is in the turned-on state, current flows from the drain electrode 18 to the source electrode 17 (in the arrow direction in FIG. 8).

Figure 8:
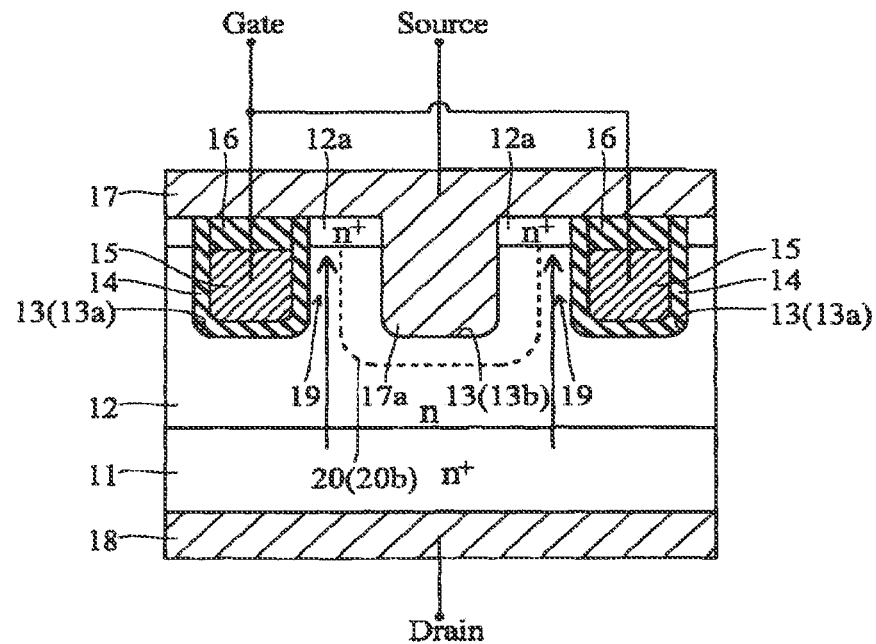
FIG. 8 is a cross sectional view illustrating an operation of the semiconductor device according to the second embodiment of the present invention.
Figure 9:
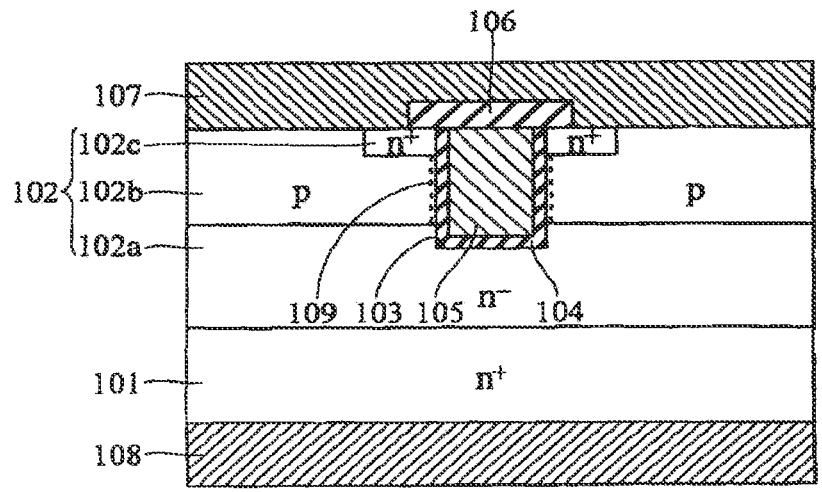
FIG. 9 is a cross sectional view illustrating a structure of a conventional MOSFET (semiconductor device).

First, as illustrated in FIGS. 7 and 8, when a negative potential and a positive potential are applied to the source electrode 17 and the drain electrode 18, respectively, the negative potential is applied to the embedded portion 17a that is provided integrally to the source electrode 17. Therefore, the periphery of the trench 13b filled with the embedded portion 17a in the source electrode 17 is in the state where majority carrier is always decreased. In other words, a depletion layer 20 (20b) is always formed around the trench 13b regardless of the turned-on state or the turned-off state.

Further, as illustrated in FIG. 7, if the semiconductor device that functions as a switch device is in the turned-off state, the applied voltage to the embedded electrode (gate electrode) 15 is controlled so that the majority carrier existing around the trench 13a filled with the embedded electrode (gate electrode) 15 decreases. Thus, around the trench 13a, there is formed a depletion layer 20 (20a) that is similar to the depletion layer 20 (20b) formed around the trench 13b.

In this case, in the region between the trench 13a and the trench 13b, the depletion layers 20a and 20b formed around the trenches 13a and 13b are overlapped with each other. In other words, in the region between the trench 13a and the trench 13b, the depletion layers 20a and 20b are connected to each other. Thus, the channel 19 is blocked with the depletion layers 20a and 20b, so that current flowing through the channel 19 can be interrupted. Therefore, the semiconductor device that functions as a switch device becomes turned off.

Next, if the semiconductor device that functions as a switch device is to be switched from the turned-off state to the turned-on state, as illustrated in FIG. 8, a predetermined positive potential (predetermined voltage) is applied to the embedded electrode (gate electrode) 15, so that the depletion layer 20a (see FIG. 7) formed around the trench 13a is deleted. In other words, the depletion layer 20a that blocks the part of the channel 19 on the embedded electrode (gate electrode) 15 side is deleted. Thus, current can flow through the part of the channel 19 on the embedded electrode (gate electrode) 15 side, so that the semiconductor device that functions as a switch device can be turned on.

In addition, if the semiconductor device that functions as a switch device is to be switched from the turned-on state to the turned-off state, the application of the predetermined positive potential to the embedded electrode (gate electrode) 15 is stopped. Thus, the state illustrated in FIG. 7 is restored, so that the semiconductor device that functions as a switch device can be turned off.

In the second embodiment, as described above, by blocking the channel 19 (each region between neighboring trenches 13) with the depletion layer 20 formed around all the trenches 13, current flowing through the channel 19 (each region between neighboring trenches 13) is interrupted. In contrast, by deleting the depletion layer 20a formed around trench 13a filled with the embedded electrode 15, current can flow through the channel 19 (each region between neighboring trenches 13). Thus, a formation state of the depletion layer 20a formed around the trench 13a changes in accordance with the applied voltage to the embedded electrode (gate electrode) 15. Therefore, by controlling the applied voltage to the embedded electrode 15, it is possible to switch from the turned-off state (in which current flowing through the channel 19 is interrupted) to the turned-on state (in which current can flow through the channel 19), and to switch in the opposite direction. In other words, the semiconductor device can have a switching function. Further, in the above-mentioned structure, in the turned-on state, the entire portion of each region between the neighboring trenches 13 in which the depletion layer 20a is deleted can function as the channel 19. Therefore, compared with the conventional MOSFET (semiconductor device) in which a very thin inversion layer functions as the channel, resistance against current flowing through the channel 19 can be reduced largely. Thus, compared with the conventional MOSFET (semiconductor device) in which a very thin inversion layer functions as the channel, on-resistance can be reduced largely.

In addition, in the second embodiment, as described above, the embedded electrode (gate electrode) 15 is filled in the trench 13a while the embedded portion 17a of the source electrode 17 is filled in the trench 13b. Thus, when the switching from the turned-off state to the turned-on state is carried out, only the depletion layer 20a formed around the trench 13a filled with the embedded electrode (gate electrode) 15 among the plurality of trenches 13 can be deleted while the depletion layer 20b formed around the trench 13b filled with the embedded portion 17a of the source electrode 17 can be left over. In this case, if one trench 13b filled with the embedded portion 17a of the source electrode 17 is disposed between the two trenches 13a filled with the embedded electrode (gate electrode) 15, the part of the channel 19 (each region between neighboring trenches 13) on the embedded portion 17a side of the source electrode 17 is always blocked with the depletion layer 20b. Therefore, a threshold voltage when the switching from the turned-off state to the turned-on state is carried out (applied voltage of the embedded electrode (gate electrode) 15 when the interruption of the current flowing through the channel 19 is stopped so as to be turned on) is increased. Thus, it is possible to suppress a tendency of an occurrence of malfunction when noise enters the semiconductor device, that the applied voltage to the embedded electrode (gate electrode) 15 may reach the threshold voltage so as to be turned on despite of the turned-off state is maintained.

In addition, in the second embodiment, as described above, the embedded portion 17a of the source electrode 17 has a Schottky contact with the n type epitaxial layer 12 inside the trench 13b. Thus, the depletion layer 20b can be formed around the trench 13b filled with the embedded portion 17a of the source electrode 17 with a simple structure without an insulator film or the like.

In addition, in the second embodiment, as described above, the embedded electrode that is filled in the trench 13b is constituted of the embedded portion 17a that is provided integrally to the source electrode 17. Thus, in the step of forming the source electrode 17, the embedded electrode filled in the trench 13b (embedded portion 17a of the source electrode 17) can be formed simultaneously. Further, a step for electrically connecting the source electrode 17 to the embedded electrode filled in the trench 13b (embedded portion 17a of the source electrode 17) becomes unnecessary. Thus, the manufacturing process can be simplified.

In addition, in the second embodiment, as described above, when the predetermined positive potential is applied to the embedded electrode (gate electrode) 15, the depletion layer 20a formed around the trench 13a is deleted. In contrast, when the application of the predetermined positive potential to the embedded electrode (gate electrode) 15 is stopped, the depletion layer 20a is formed around the trench 13a. Thus, by controlling the applied voltage to the embedded electrode (gate electrode) 15, it is easy to switch from the turned-off state to the turned-on state and to switch in the opposite direction.

In addition, in the second embodiment, as described above, in the turned-off state, the depletion layer 20 formed around the neighboring trenches 13 are connected to each other. Thus, the channel 19 (each region between neighboring trenches 13) can securely be blocked with the depletion layer 20.

In addition, in the second embodiment, as described above, the distance between the neighboring trenches 13 is set so that the depletion layers 20 formed around neighboring trenches 13 are overlapped with each other, so that the depletion layers 20 formed around the neighboring trenches 13 can easily be connected to each other.

Note that the embodiments disclosed here should be interrupted to be merely examples in all points and not a limitation. The scope of the present invention is defined not by the above description of the embodiments but by the claims, which includes every modification within the meaning and the range that are equivalent to the claims.

For instance, in the first and the second embodiments, a plurality of trenches formed in the n type epitaxial layer, so that each region between the neighboring trenches in the n type epitaxial layer functions as a channel, but the present invention is not limited to this structure. Another structure may be adopted in which a plurality of trenches are formed in the p type epitaxial layer, so that each region between the neighboring trenches in the p type epitaxial layer functions as a channel.

In addition, in the first and the second embodiments, the depth of the trench is adapted to be smaller than the thickness of the n type epitaxial layer, but the present invention is not limited to this structure. Another structure may be adopted in which the trench penetrates the n type epitaxial layer and reaches the $n^+$ type silicon substrate.

In addition, in the first and the second embodiments, the upper surface of the interlayer insulator film is flush with the upper surface of the n type epitaxial layer, but the present invention is not limited to this structure. The upper surface of the interlayer insulator film may be positioned higher than the upper surface of the n type epitaxial layer, or the upper surface of the interlayer insulator film may be positioned lower than the upper surface of the n type epitaxial layer.

In addition, in the second embodiment, the source electrode constituted of a single aluminum layer is used, but the present invention is not limited to this structure. It is possible to use the source electrode that is constituted of a lower barrier metal layer and an upper aluminum layer. In this case, it is preferable that a lowest layer of the barrier metal layer should be a Ti layer that has a Schottky contact with the n type epitaxial layer.

What is claimed is:
1. A semiconductor device comprising:
   a semiconductor layer of one conductivity type including a plurality of trenches arranged with predetermined spaces, so that each region between the neighboring trenches becomes a channel; and
   a plurality of embedded electrodes each of which is formed on an inner surface of each of the plurality of trenches via an insulator film so as to fill in each of the plurality of trenches, the semiconductor device switching between an on state and an off state according to a voltage applied to the plurality of embedded electrodes, wherein the plurality of trenches have substantially the same width and substantially the same depth as one another, wherein all semiconductor material adjacent the trenches is of the one conductivity type, wherein a concentration of an impurity of the one conductivity type is substantially the same in the channel of the semiconductor layer and in a region of the semiconductor layer on a bottom side of the plurality of trenches, wherein the plurality of embedded electrodes include two types, which are a first embedded electrodes and second embedded electrodes to which voltages are applied separately, and wherein in the off state, each depletion layer formed around any of the plurality of trenches blocks a region between the neighboring trenches, and in the on state, a depletion layer, formed around any of the plurality of trenches in which the first type of embedded electrode is embedded, disappears to permit current to flow through the region between the neighboring trenches.

2. The semiconductor device according to claim 1, wherein the plurality of embedded electrodes are arranged with a predetermined spaces so that at least one of the second embedded electrodes is disposed between two of the first embedded electrodes.

3. The semiconductor device according to claim 1, wherein the applied voltage to the second embedded electrode is controlled so that the depletion layer is formed around the trench filled with the second embedded electrode among the plurality of trenches regardless of the case where current flowing through each region between the neighboring trenches is interrupted or the case where current flows through each region between the neighboring trenches.

4. The semiconductor device according to claim 1, wherein a predetermined voltage is applied to the first embedded electrode so that the depletion layer formed around the trench filled with the first embedded electrode among the plurality of trenches is deleted, while the application of the predetermined voltage to the first embedded electrode is stopped so that the depletion layer is formed around the trench filled with the first embedded electrode among the plurality of trenches.

5. The semiconductor device according to claim 1, wherein the depletion layers formed around the neighboring trenches are connected to each other when current flowing through each region between the neighboring trenches is interrupted.

6. The semiconductor device according to claim 1, wherein a distance between the neighboring trenches is set so that the depletion layers formed around the neighboring trenches are overlapped with each other.

7. The semiconductor device according to claim 1, further comprising:

an electrode layer formed on the upper surface of the semiconductor layer so as to cover an opening end of the trench; and an interlayer insulator film for insulating between the embedded electrode and the electrode layer, wherein the embedded electrode is filled in the trench to a halfway depth, and the interlayer insulator film is filled in the remaining part of the trench in which the embedded electrode is not filled in, so that an upper surface of the interlayer insulator film becomes flush with the upper surface of the semiconductor layer.

8. A semiconductor device comprising:

a semiconductor layer of one conductivity type including a plurality of trenches arranged with predetermined spaces, so that each region between the neighboring trenches becomes a channel;

a first embedded electrode filled in a predetermined trench among the plurality of trenches via an insulator film; and a second embedded electrode filled in a trench other than the trench filled with the first embedded electrode, so as to be applied with a voltage separately from the first embedded electrode and to have a Schottky contact with the semiconductor layer inside the trench, the semiconductor device switching between an on state and an off state according to a voltage applied to the plurality of embedded electrodes, wherein the plurality of trenches have substantially the same width and substantially the same depth as one another, wherein semiconductor material neighboring the trenches is only of the one conductivity type, wherein a concentration of an impurity of the one conductivity type is substantially the same in the channel of the semiconductor layer and in a region of the semiconductor layer on a bottom side of the plurality of trenches, and wherein in the off state, every depletion layer formed around the trenches blocks a region between the neighboring trenches, and in the on state, a depletion layer, formed around any of the plurality of trenches in which the first type of embedded electrode is embedded, disappears to permit current to flow through the region between the neighboring trenches.

9. The semiconductor device according to claim 8, further comprising an electrode layer formed on the upper surface of the semiconductor layer, wherein the electrode layer includes an embedded portion filled in a trench other than the trench filled with the first embedded electrode, and the second embedded electrode is constituted of the embedded portion of the electrode layer.

10. The semiconductor device according to claim 8, wherein the first embedded electrode and the second embedded electrode are filled in the plurality of trenches so that at least one of the second embedded electrodes is disposed between two of the first embedded electrodes.

11. The semiconductor device according to claim 8, wherein the applied voltage to the second embedded electrode is controlled so that the depletion layer is formed around the trench filled with the second embedded electrode regardless of the case where current flowing through each region between the neighboring trenches is interrupted or the case where current flows through each region between the neighboring trenches.

12. The semiconductor device according to claim 8, wherein a predetermined voltage is applied to the first embedded electrode so that the depletion layer formed around the trench filled with the first embedded electrode is deleted, while the application of the predetermined voltage to the first embedded electrode is stopped so that the depletion layer is formed around the trench filled with the first embedded electrode.

13. The semiconductor device according to claim 8, wherein the depletion layers formed around the neighboring trenches are connected to each other when current flowing through each region between the neighboring trenches is interrupted.

14. The semiconductor device according to claim 8, wherein a distance between the neighboring trenches is set so that the depletion layers formed around the neighboring trenches are overlapped with each other.

* * * * *